United States Patent
Lin

(10) Patent No.: US 7,056,792 B2
(45) Date of Patent: Jun. 6, 2006

(54) STACKED GATE FLASH MEMORY DEVICE AND METHOD OF FABRICATING THE SAME

(75) Inventor: Chi-Hui Lin, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/819,464

(22) Filed: Apr. 6, 2004

(65) Prior Publication Data

US 2004/0188751 A1 Sep. 30, 2004

Related U.S. Application Data

(62) Division of application No. 10/621,431, filed on Jul. 16, 2003, now Pat. No. 6,781,191.

(30) Foreign Application Priority Data

Oct. 21, 2002 (TW) ............................. 91124264 A

(51) Int. Cl.
*H01L 21/336* (2006.01)

(52) U.S. Cl. ..................................... 438/259

(58) Field of Classification Search ........ 438/257–267; 257/314–320, E21.179, E21.422, E21.68, 257/E21.681, E21.683, E21.686, E21.687, 257/E21.688
See application file for complete search history.

(56) References Cited

U.S. PATENT DOCUMENTS

| | | | |
|---|---|---|---|
| 5,386,132 A | 1/1995 | Wong | 257/316 |
| 5,429,970 A * | 7/1995 | Hong | 438/259 |
| 5,606,521 A * | 2/1997 | Kuo et al. | 365/149 |
| 6,124,608 A * | 9/2000 | Liu et al. | 257/315 |
| 6,391,719 B1 * | 5/2002 | Lin et al. | 438/259 |
| 6,706,592 B1 | 3/2004 | Chern et al. | 438/257 |
| 6,818,948 B1 * | 11/2004 | Lin | 257/330 |
| 2002/0024081 A1 | 2/2002 | Gratz | 257/301 |
| 2004/0077147 A1 | 4/2004 | Lin | 438/259 |

* cited by examiner

*Primary Examiner*—Brook Kebede
(74) *Attorney, Agent, or Firm*—Ladas & Parry LLP

(57) ABSTRACT

A stacked gate flash memory device and method of fabricating the same. A cell of the stacked gate flash memory device in accordance with the invention is disposed in a cell trench within a substrate to achieve higher integration of memory cells.

23 Claims, 15 Drawing Sheets

STACKED GATE FLASH MEMORY DEVICE AND METHOD OF FABRICATING THE SAME

CROSS-REFERENCE TO RELATED APPLICATIONS

This patent application is a divisional application of U.S. Ser. No. 10/621,431, filed on Jul. 16, 2003 now U.S. Pat. No. 6,781,191, which claims priority to Taiwanese Application No. 91124264, filed on Oct. 21, 2002.

BACKGROUND OF THE INVENTION

1. Field of the Invention

The present invention relates to a semiconductor device and method of fabricating the same. More particularly, it relates to a stacked gate flash memory device that can achieve high memory cell capacity.

2. Description of the Related Art

Complementary metal oxide semiconductor (CMOS) memory is generally categorized into two groups: random access memory (RAM) and read only memory (ROM). RAM is a volatile memory, wherein the stored data is erased when power is turned off. On the contrary, turning off power does not affect the stored data in a ROM.

In the past few years, market share of ROM has been continuously expanding, and the type attracting the most attention has been flash memory. The fact that a single memory cell is electrically programmable and multiple memory cell blocks are electrically erasable allows flexible and convenient application, superior to electrically programmable read only memory (EPROM), electrically erasable programmable read only memory (EEPROM) and programmable read only memory (PROM). Furthermore, fabricating flash memory is cost effective. Having the above advantages, flash memory has been widely applied in consumer electronic products, such as digital cameras, digital video cameras, mobile phones, notebooks, personal stereos and personal digital assistants (PDA).

Since portability of these electrical consumer products is strongly prioritized by consumers, the size of the products must be minimal. As a result, capacity of flash memory must increase, and functions must be maximized while size thereof is continuously minimized. Having an increased amount of access data, capacity of memory cells has been enhanced from 4 to 256 MB, and even 1G byte will become the market trend in the near future.

Hence, there is a need for a flash memory device with high memory cell capacity.

SUMMARY OF THE INVENTION

Accordingly, an object of the invention is to provide a stacked gate flash memory device that can achieve high integration of memory cells thereof.

Another object of the invention is to provide a method of fabricating a stacked gate flash memory device, wherein the size of memory cells thereof can be reduced and the coupling ratio of the control gate to the floating gate can be also increased.

Moreover, the invention provides a method of fabricating a stacked gate flash memory device, wherein the driving currents thereof can be increased without increasing the surface size thereof.

Thus, a stacked gate flash memory cell in accordance with the present invention comprises a substrate having a trench therein. A conductive layer is disposed on the bottom of the trench. A pair of source regions are each respectively disposed in the substrate adjacent one sidewall of the trench and electrically connected by the conductive layer. A source isolation layer is disposed on the conductive layer. A pair of tunnel oxide layers are each respectively disposed on one sidewall of the trench and the source isolation layer. A U-shaped floating gate is disposed on the source isolation layer, and connects the tunnel oxide layers thereby. A pair of control gate spacers are each respectively disposed on each vertical portion of the U-shaped floating gate, substantially having the same width as the vertical portions. A U-shaped inter-gate dielectric layer is disposed on the U-shaped floating gate and the control gate spacers. A control gate is disposed in the U-shaped inter-gate dielectric and a drain region is disposed in the substrate adjacent to the trench.

Furthermore, the method of fabricating the stacked gate flash memory cell in accordance with the present invention comprises providing a substrate, forming a plurality of parallel long trenches along a first direction in the substrate, forming a conductive layer and a pair of source regions on the bottom of each long trench, wherein the source regions are respectively disposed in the substrate adjacent to two sidewalls of each long trench and electrically connected by the conductive layer therein, forming a source isolation layer on each conductive layer, forming a tunnel oxide on two sidewalls of each long trench, forming a U-shaped floating gate on each source isolation layer, contacting the tunneling oxide layers, forming a pair of control gate spacers respectively, disposed on the vertical portion of the U-shaped floating gate, substantially having the same width as the vertical portions, forming an U-shaped inter-gate dielectric layer on each U-shaped floating gate and the control gate spacers, forming a control gate in each U-shaped inter-gate dielectric layer, forming a plurality of parallel shallow trench isolation (STI) regions along a second direction, defining a plurality of cell trenches and forming a drain region in the substrate adjacent to each cell trench.

In the present invention, the trench-type stacked gate flash memory device disposed in cell trenches within a substrate can achieve higher integration of memory cell capacity than that in the Prior Art.

In addition, most of the fabricating processes in the invention are self-aligned and additional lithography processes and number of masks for the whole fabricating process can be reduced. The complexity of fabrication is reduced and can be easily achieved. The higher coupling ratio by the memory cells also provides a lower operating voltage thereof.

Furthermore, most patterns of the masks for fabricating the stacked gate flash memory device are rectangular and can be easily fabricated. The costs of mask fabrication can be reduced and resolution limitations by the photolithography tools can be reduced.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
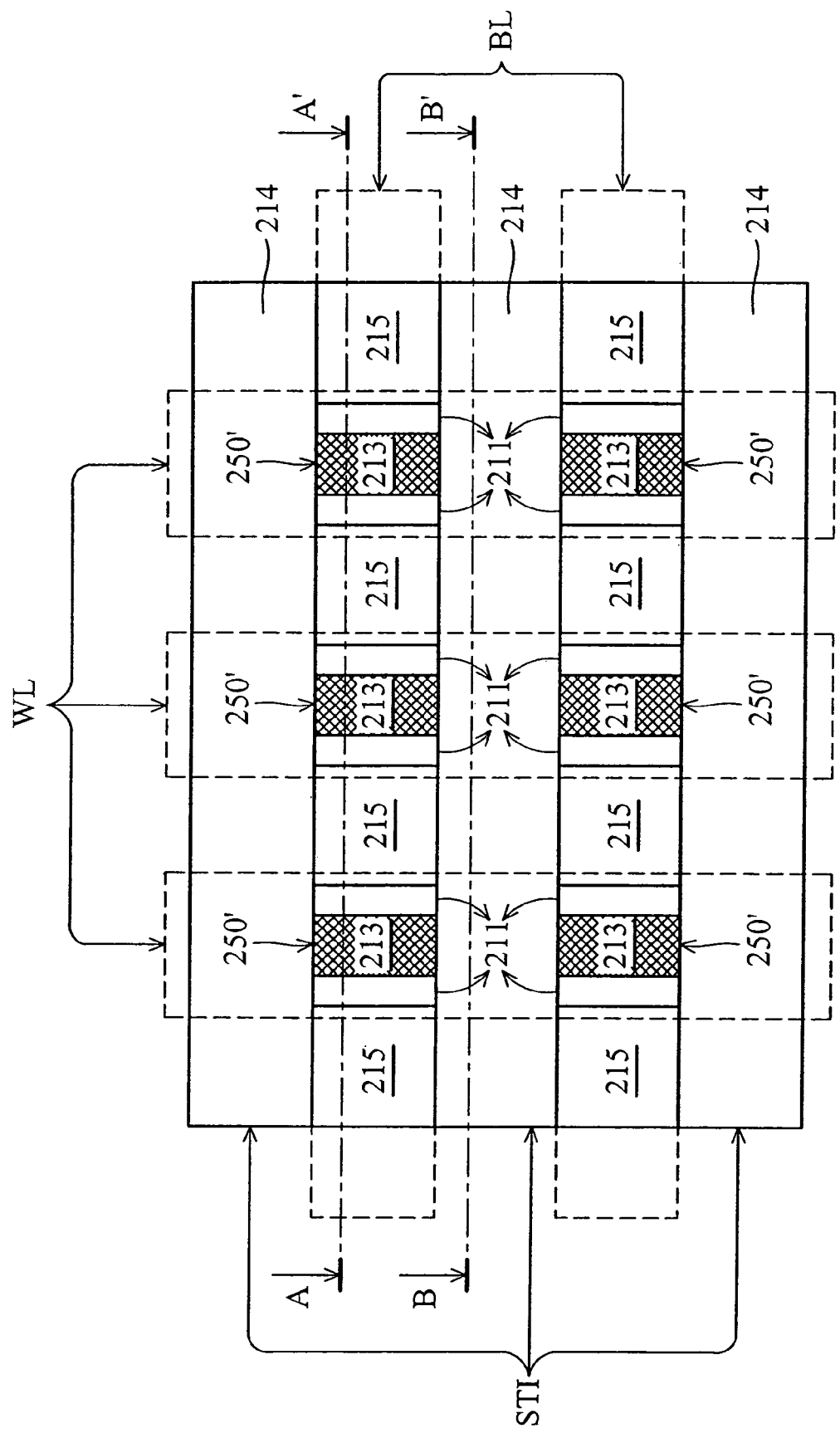
FIG. 1 is schematic top view of stacked gate flash memory devices of the invention.

The present invention provides a stacked gate flash memory device that meets the demand for increased capacity of memory cells. In FIG. 1, a top view of the stacked gate flash memory device in accordance with the present invention is shown. Structure of individual memory cells is disposed in the cell trenches (referring to trench 250') along the A~A' phantom line, between two shallow isolation trench (referring to STI) regions along the B~B' phantom line.

FIG. 3a~3l and FIG. 4a~4l respectively illustrate the cross-sections of a fabricating process along lines A~A' and lines B~B' according to an embodiment of the present invention. Moreover, FIGS. 2a and 2b also illustrate corresponding top views of the fabricating process.

Figure 3A:
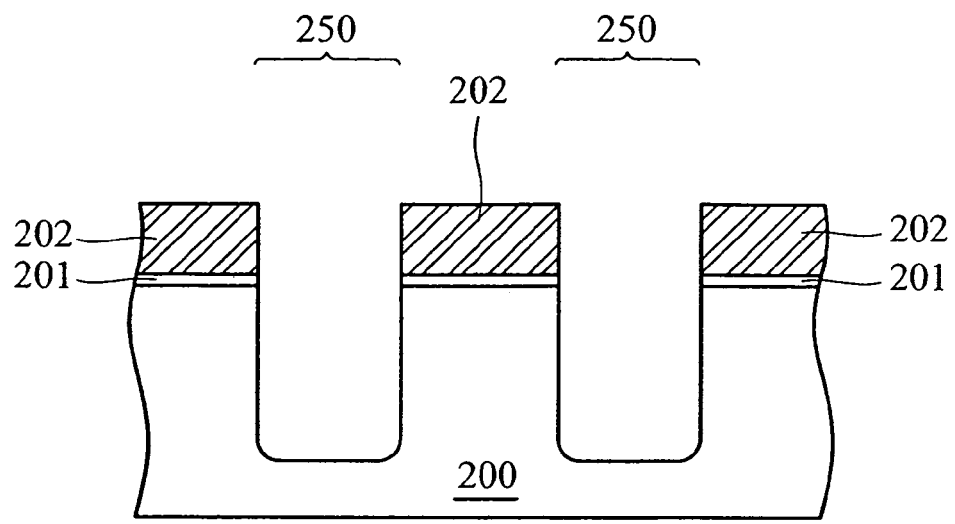
FIG. 3a~3l are cross-sections of the fabricating process along the A–A' phantom line in FIG. 1.
Figure 3B:
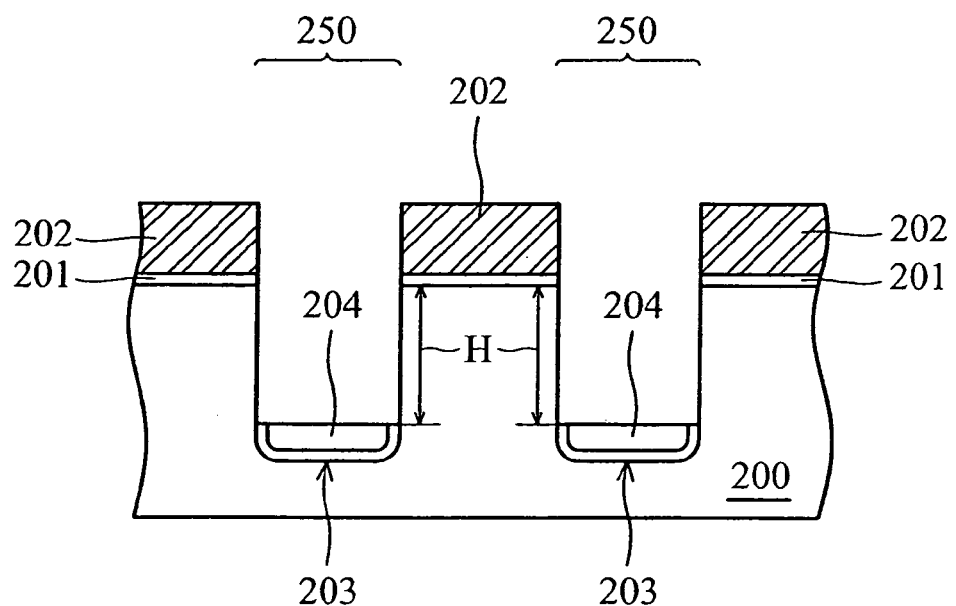
Figure 3C:
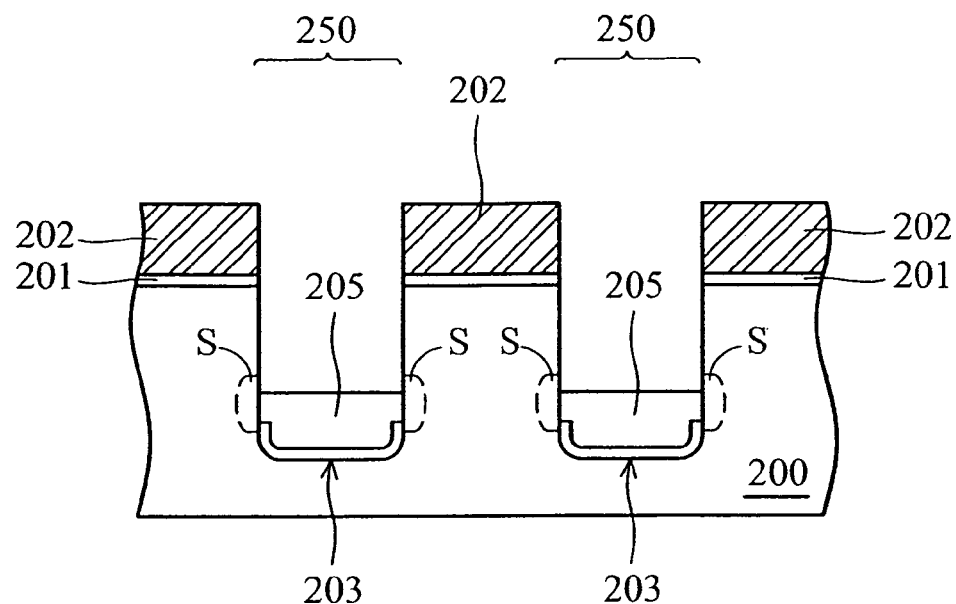
Figure 3D:
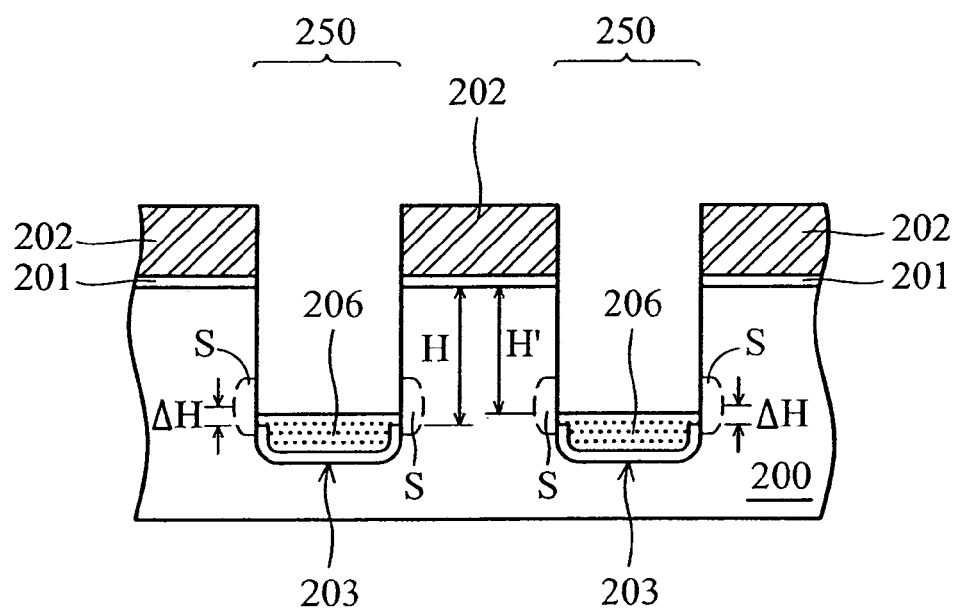
Figure 3E:
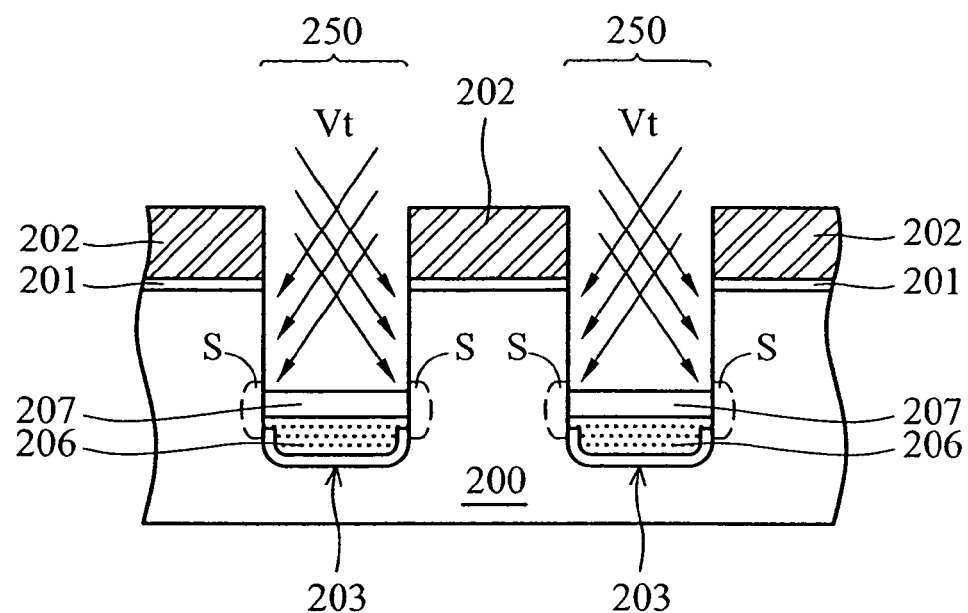
Figure 3F:
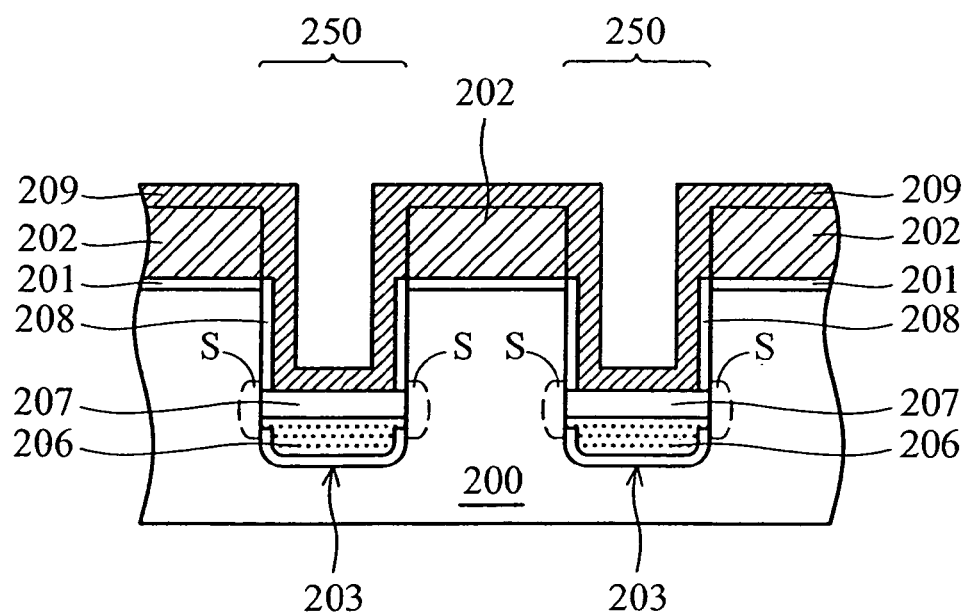
Figure 3G:
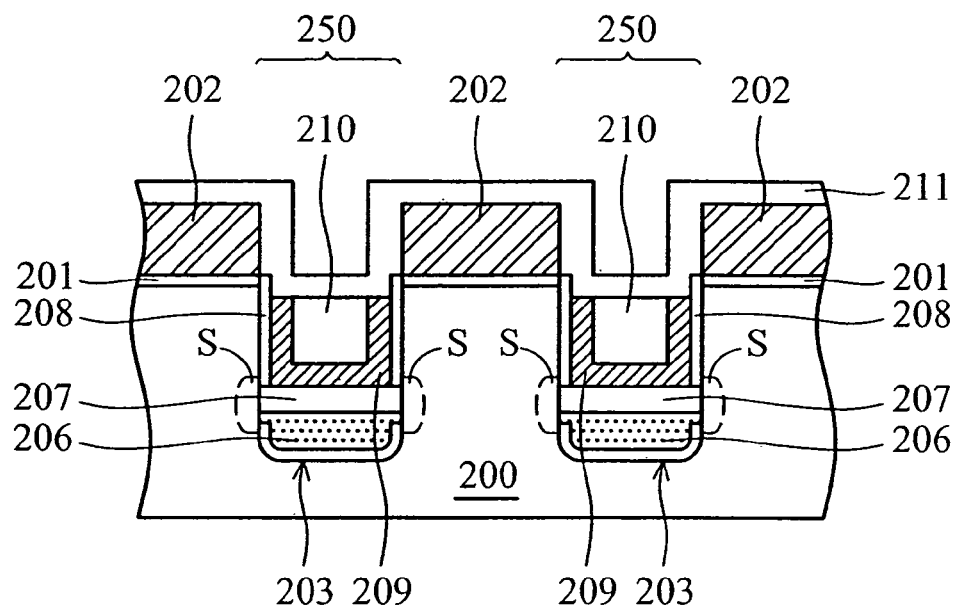
Figure 3H:
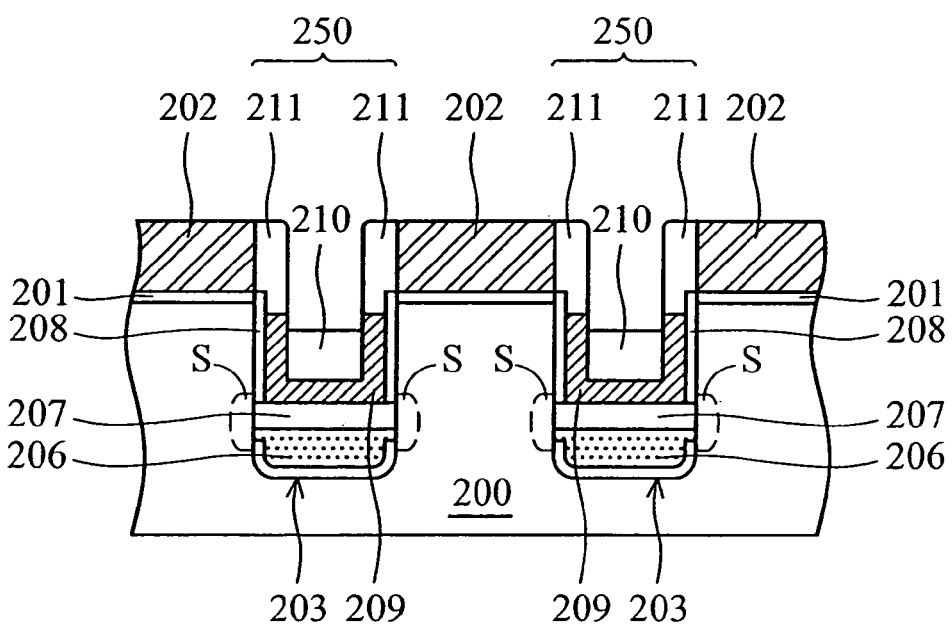
Figure 3I:
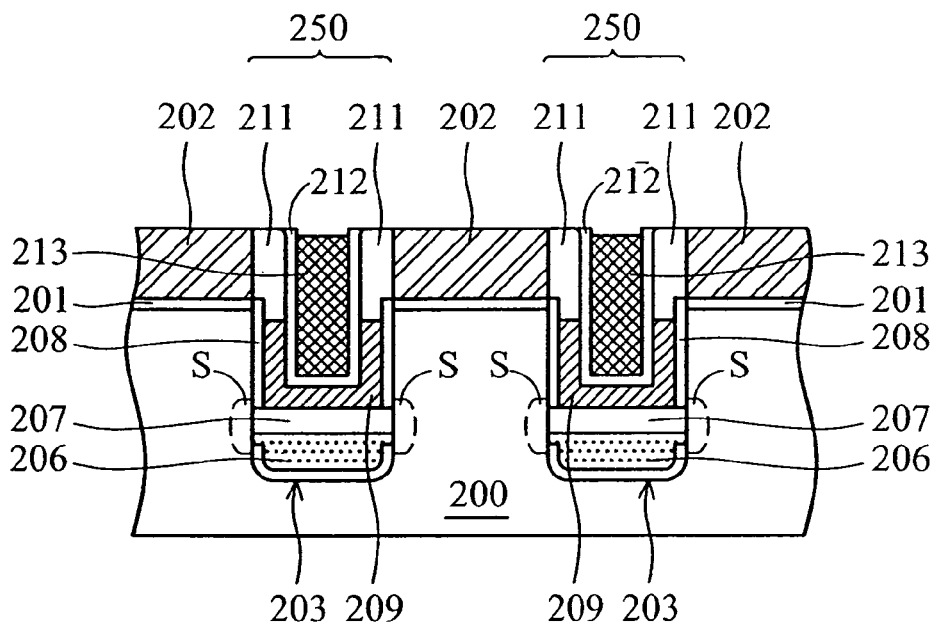
Figure 3J:
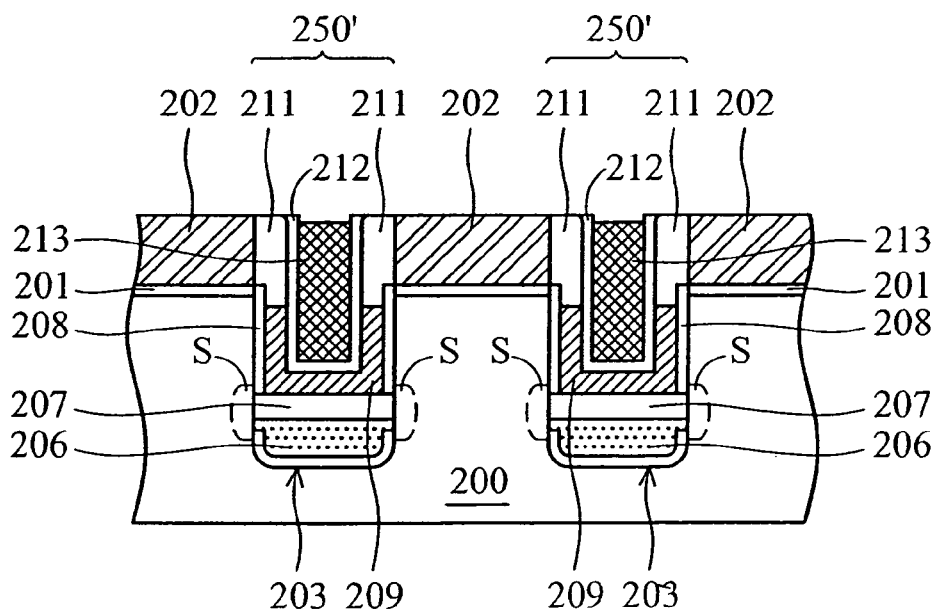
Figure 3K:
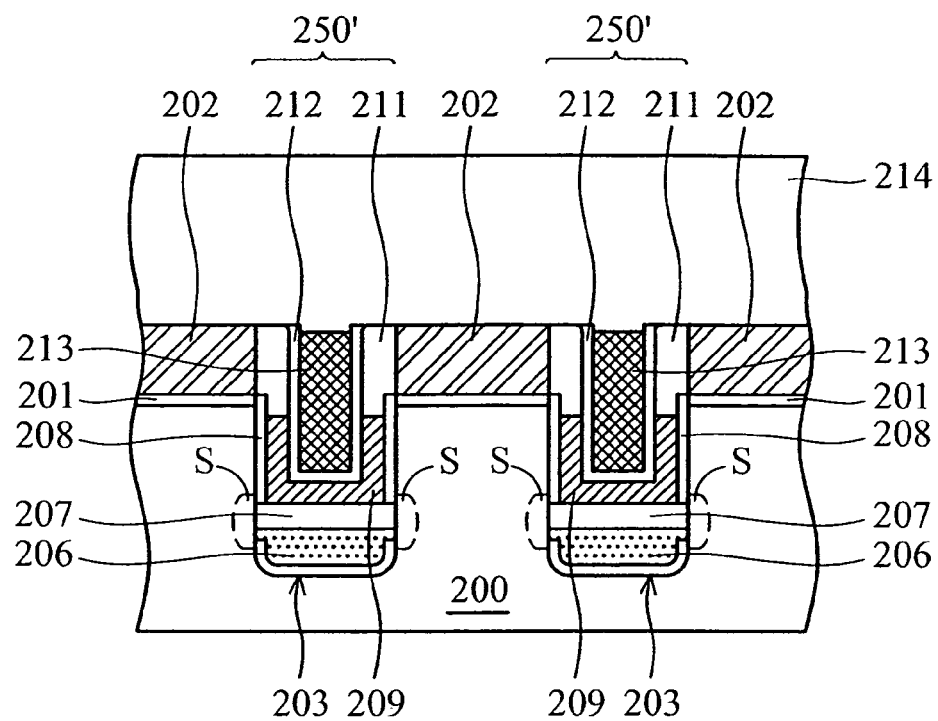
Figure 3L:
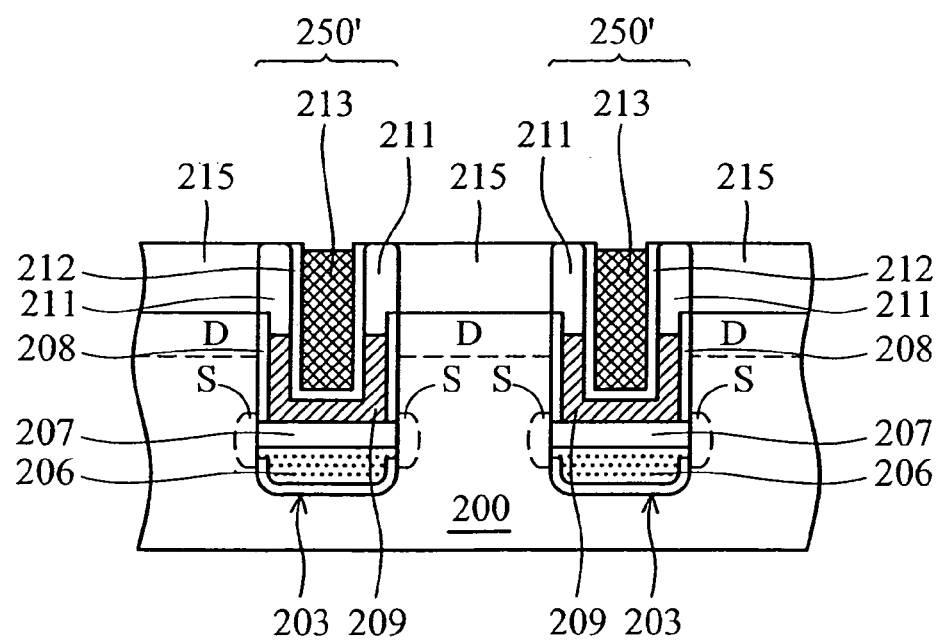

First, FIG. 3l illustrates a cross-section of the stacked gate flash memory cells in accordance with the present invention. A memory cell comprises a trench 250' disposed in the substrate 200, and a conductive layer 206 disposed on the bottom of the trench 250'. A pair of source regions S are each respectively disposed in the substrate 200 adjacent to sidewalls of the trench 250'. A source isolation layer 207 is disposed on the conductive layer 206. A pair of tunnel oxide layers 208 are each respectively disposed on one sidewall of the trench 250' and the source isolation layer 207. A U-shaped floating gate 209 is disposed on the source isolation layer 207 and contacts the tunnel oxide layers 208 thereby. A pair of control gate spacers 211 are each respectively disposed on each vertical portion of the U-shaped floating gate 209. A U-shaped inter-gate dielectric layer 212 is disposed on the U-shaped floating gate 209 and the control gate spacers 211. A control gate 213 is disposed in the U-shaped inter-gate dielectric 212, and a drain region D is disposed in the substrate 200 adjacent to the trench 250'.

Figure 2A:
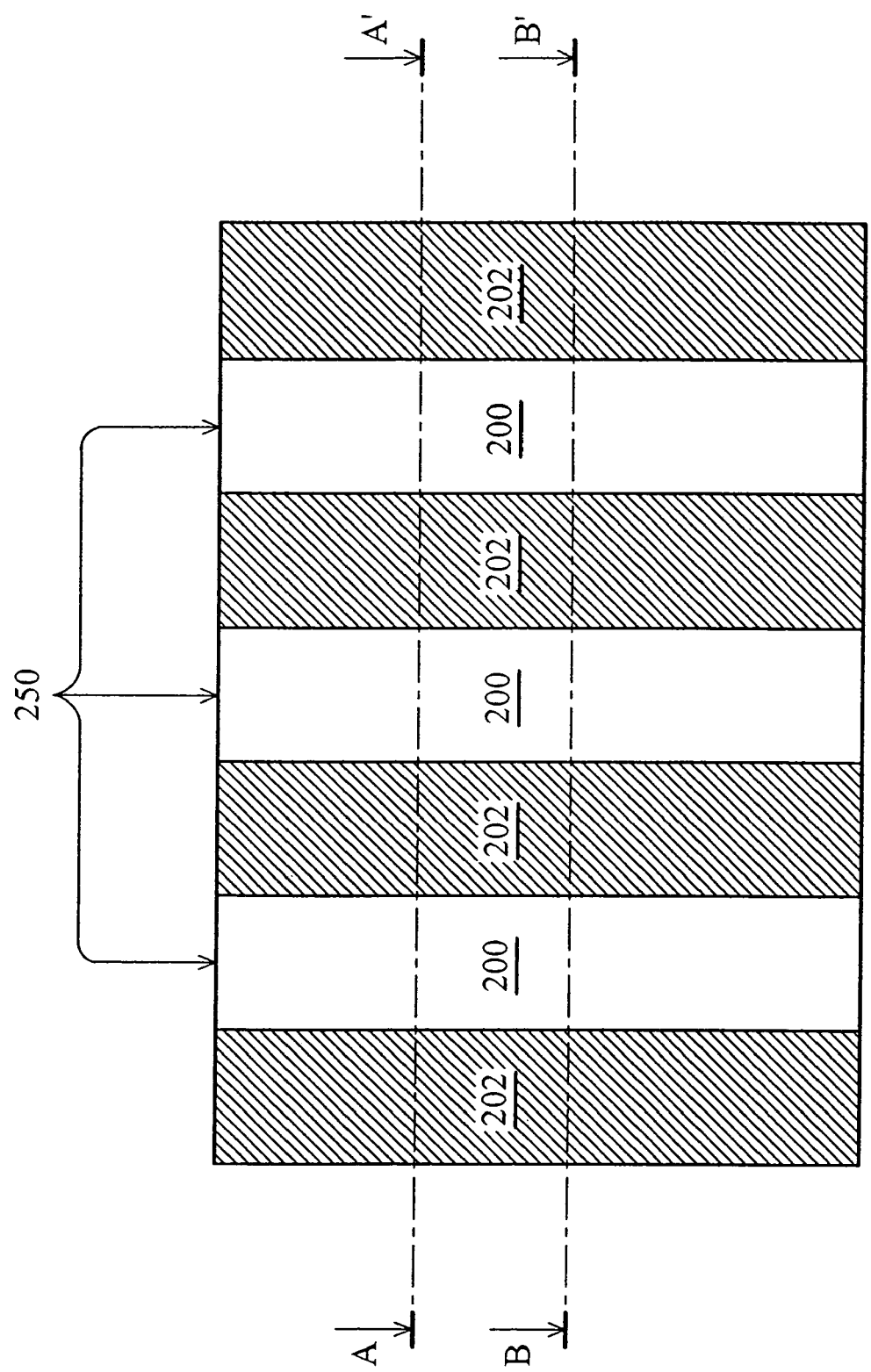
FIG. 2a is a schematic top view of corresponding cross-sections in FIG. 3a and FIG. 4a for one embodiment of the invention.
Figure 4A:
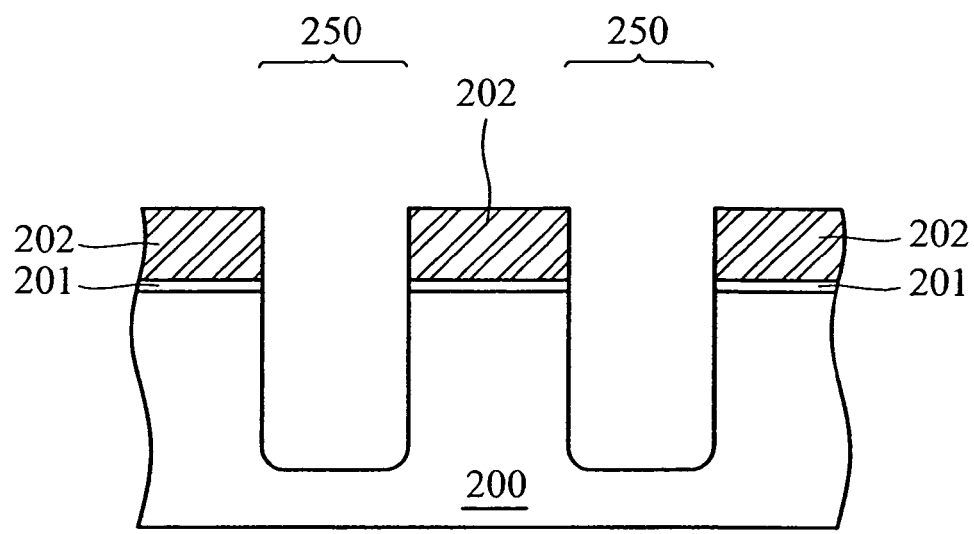
FIG. 4a~4l are cross-sections of the fabricating process along the B–B' phantom line in FIG. 1.

In FIGS. 3a and 4a, a semiconductor substrate 200, for example a P-type silicon substrate, is provided. Next, a pad oxide layer 201 and a mask layer 202 are sequentially formed on the substrate 200 and then sequentially defined by subsequent lithography and etching, forming a plurality of long trenches 250 with a depth about 30000 Å to 70000 Å in the substrate 200. The long trenches 250 are parallel to each other along a first direction. This top view is shown in FIG. 2a and the depth of a long trench 250 affects the channel length of each stacked gate flash memory cell and the resistance of a source line.

Figure 4B:
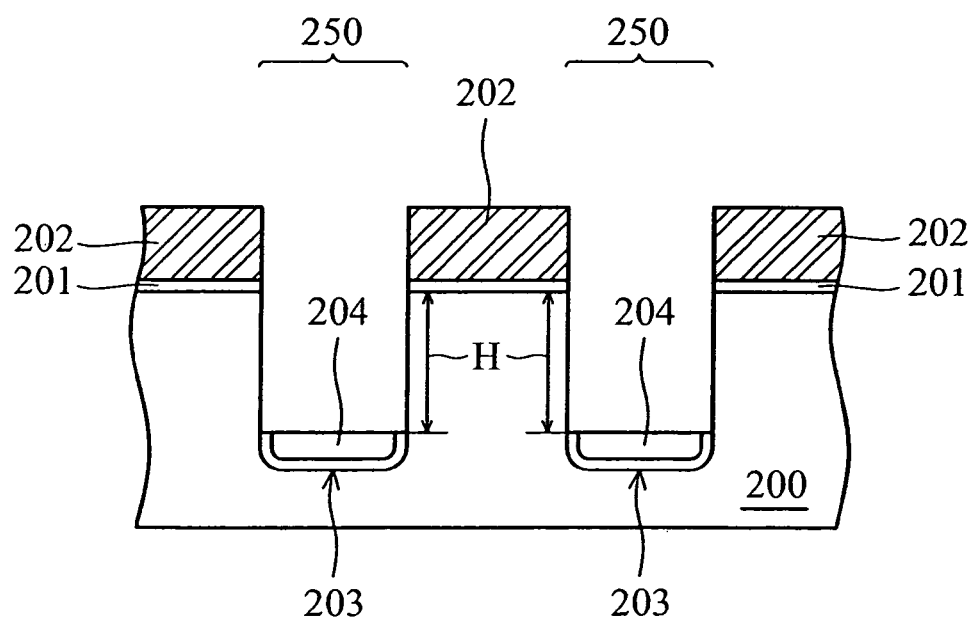

Next, in FIGS. 3b and 4b, a conformable bottom insulating layer 203 is deposited on mask layer 202 and in the long trench 250. The material of the insulating layer 203, for example, can be silicon dioxide. Then materials of a protective layer 204 are deposited on the bottom insulating layer 203 and fill the long trench 250. Material of protective layer 204, for example, can be photoresist. The protective layer 204 is then etched back and recessed to a depth H to the surface of the substrate 200. The depth H is about 2500 Å to 3500 Å. Then the bottom insulating layer 203 exposed by the residue protective layer 204 is removed. Thus, a bottom insulating layer 203 having a same depth H from the surface of the substrate 200 as that of the protective layer 204 is left in the long trench 250.

Figure 4C:
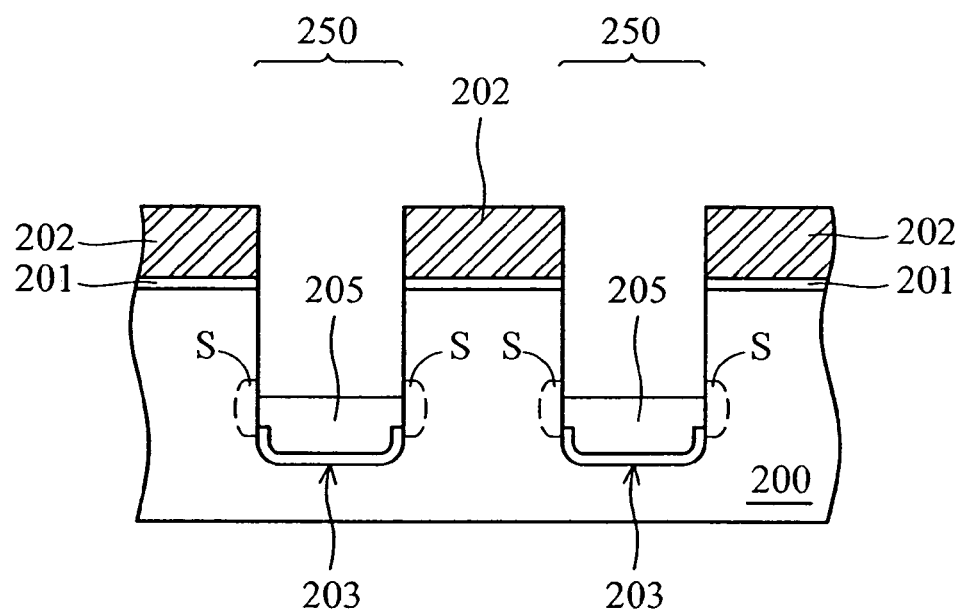

In FIGS. 3c and 4c, the residual protective layer 204 in the long trench 250 is then removed by a proper solvent (not shown). Next, a source material layer 205 is formed by sequential deposition, etch-back, and recession of impurities comprising doped materials such as N-type dopant doped polysilicon, for example, and preferably phosphorous (P) doped or arsenic (As) doped polysilicon. Thickness of the source material layer 205 is between 500 Å and 1000 Å. Next, a thermal annealing process, for example a furnace annealing process (not shown), is performed to drive out dopants (such as arsenic or phosphorous) from the source material layer 205 into the substrate 200 adjacent to the long trench 250. Thus, a pair of source regions S are each respectively formed in the substrate 200.

Figure 4D:
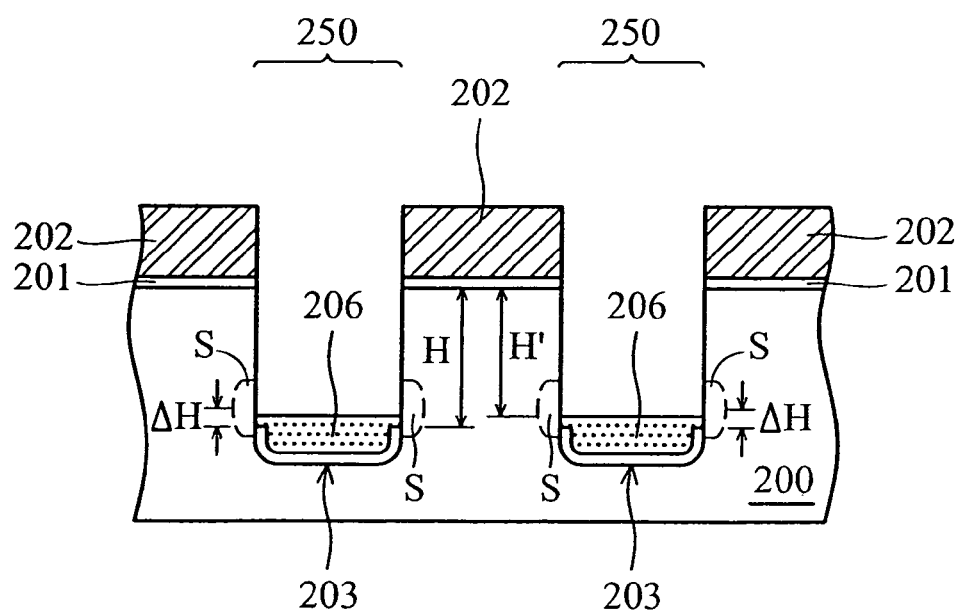

In FIGS. 3d and 4d, the conductive materials of the source material layer 205 are further recessed to a depth H' from the surface of the substrate 200. Thus, a conductive layer 206 with a thickness H' is left in the long trench 250 and connects the adjacent source regions S by the conductive properties of the residual dopnats (such as arsenic or phosphorous) therein. Moreover, a depth difference ΔH between the bottom insulating layer 203 and the conductive layer 206 is about 200 Å to 300 Å.

Figure 4E:
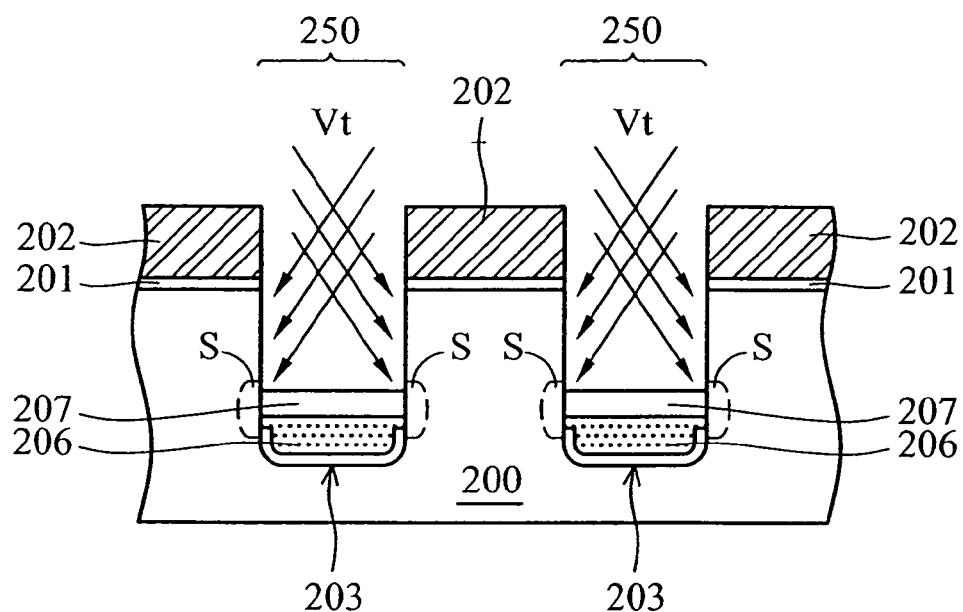

In FIG. 3e and FIG. 4e, a source isolation layer 207 with a thickness between 500 Å and 1000 Å is then formed on the conductive layer 206, and limitation of an electrical connection between the source regions S is fully achieved by the conductive layer 206 therebelow. The source isolation layer 207 is formed by sequential deposition, etch-back, and recession of insulating materials such as silicon dioxide, for example. Next, a threshold voltage implantation Vt is performed on sidewalls of the long trench 250 to adjust the threshold voltage of each memory cell.

Figure 4F:
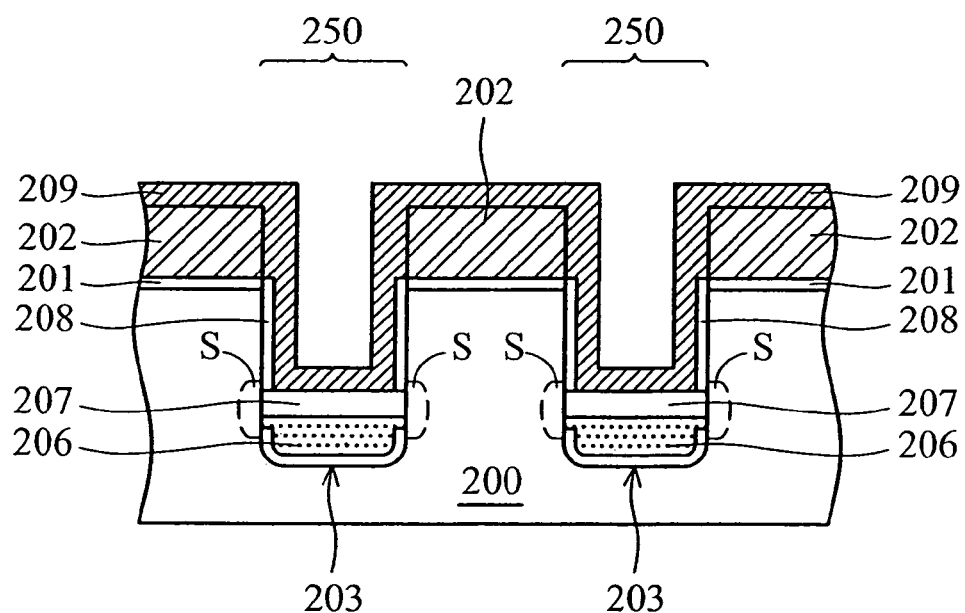

In FIG. 3f and FIG. 4f, a tunnel oxide layer 208 is formed on the two sidewalls of the long trench 250. The tunnel oxide layer 208 can be, for example, silicon dioxide formed by thermal oxidation with a thickness between 80 Å and 150 Å. Next, a conformable floating gate layer 209 is formed on the mask layer 202 and in the long trench 250 and contacts the tunnel oxide layers 208 thereby. Materials of the floating gate layer 209 can be, for example, N-type dopant doped polysilicon formed by LPCVD and the thickness thereof is between 300 Å and 500 Å.

Figure 4G:
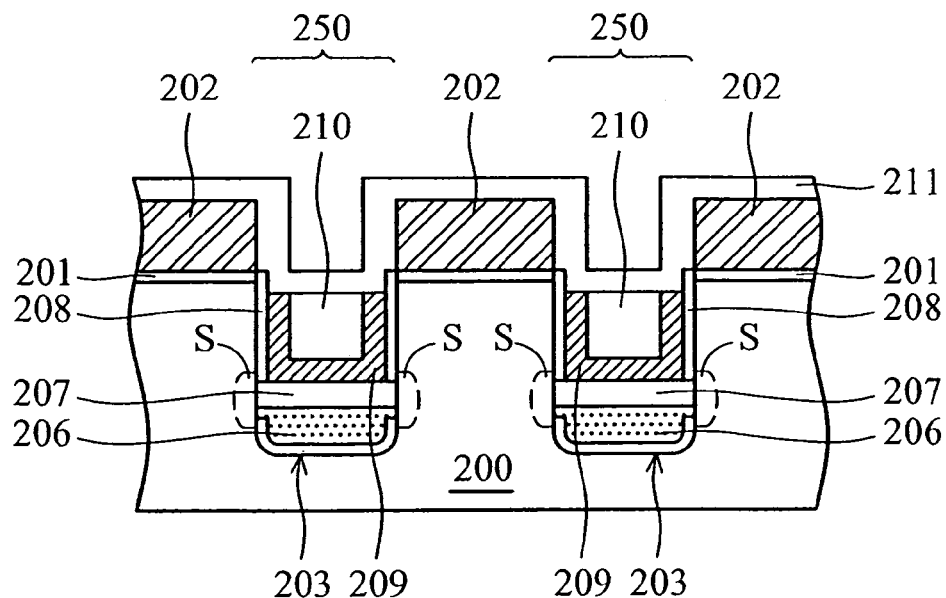

In FIGS. 3g and 4g, another protective layer 210 with a surface slightly below the surface of the substrate 200 is formed in the long trench 250 and exposes portions of the floating gate layer 209. The protective layer 210 is formed by sequential deposition, etch-back, and recession of materials such as boro-silicate-glass (BSG) formed by APCVD. The portions of the floating gate layer 209 exposed by the protective layer 210 are removed, leaving a U-shaped floating gate 209 in the long trench 250 as a floating gate and on the source isolation layer 207 and contacts the tunnel oxide layers 208. Then a conformable control gate spacer layer 211 is formed on the mask layer 202 and in the long trench 250. The control gate spacer layer 211 can be, for example, silicon dioxide formed by LPCVD.

Figure 4H:
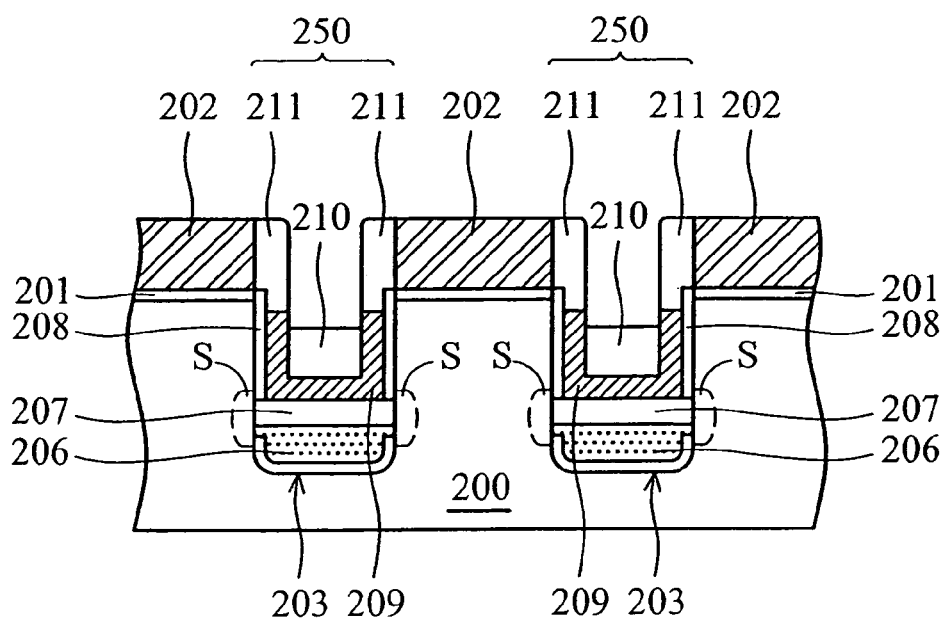

In FIG. 3h and FIG. 4h, the control gate spacer layer 211 is then etched, leaving control gate spaces 211 substantially having the same width as the vertical portions of the U-shaped floating gate 209 on sidewalls of the long trench 250. In addition, materials of the control gate spacer layer 211 and the protective layer 210 are similar, such as silicon dioxide and BSG here. Thus, during etching of the control gate spacer layer 211, the protective layer 210 is lightly etched and the thickness thereof is also decreased by the described etching.

Figure 4I:
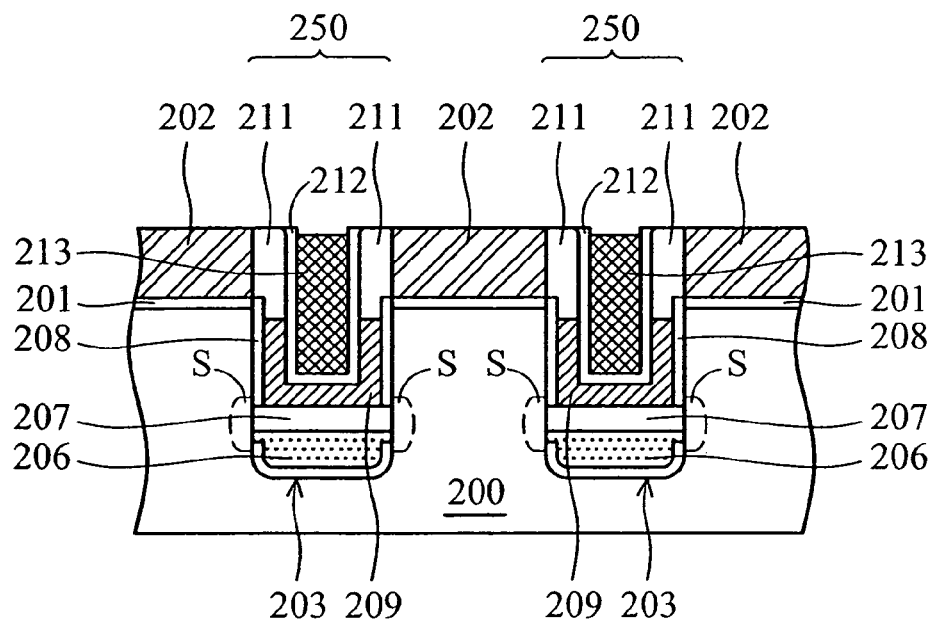

In FIG. 3i and FIG. 4i, the protective layer 210 is then removed by, for example, wet etching, leaving control gate spacers 211. Next, a conformable inter-gate dielectric layer 212 formed by, for example LPCVD, is deposited on the mask layer 202 and in the long trench 250. The material of the inter-gate dielectric layer 212 can be, for example, silicon dioxide with thickness between 100 Å and 200 Å. Then a control gate 213 is formed in the long trench 250 and on the mask layer 202. The control gate 213 is formed by sequential deposition, etch-back, and recession of conductive materials such as N-type dopant doped polysilicon formed by LPCVD. The thickness of the deposited conductive materials is between 1000 Å and 1500 Å. Next, the control gate layer 213 and the inter-gate dielectric layer 212 are etched and a U-shaped inter-gate dielectric layer 212 and a control gate (the residual control gate layer 213) therein are formed in the long trench 250. The coupling ratio between the control gate and the floating gate can be increased by the additional contact surfaces provided by the U-shaped inter-gate dielectric layer 209 therebetween.

Figure 2B:
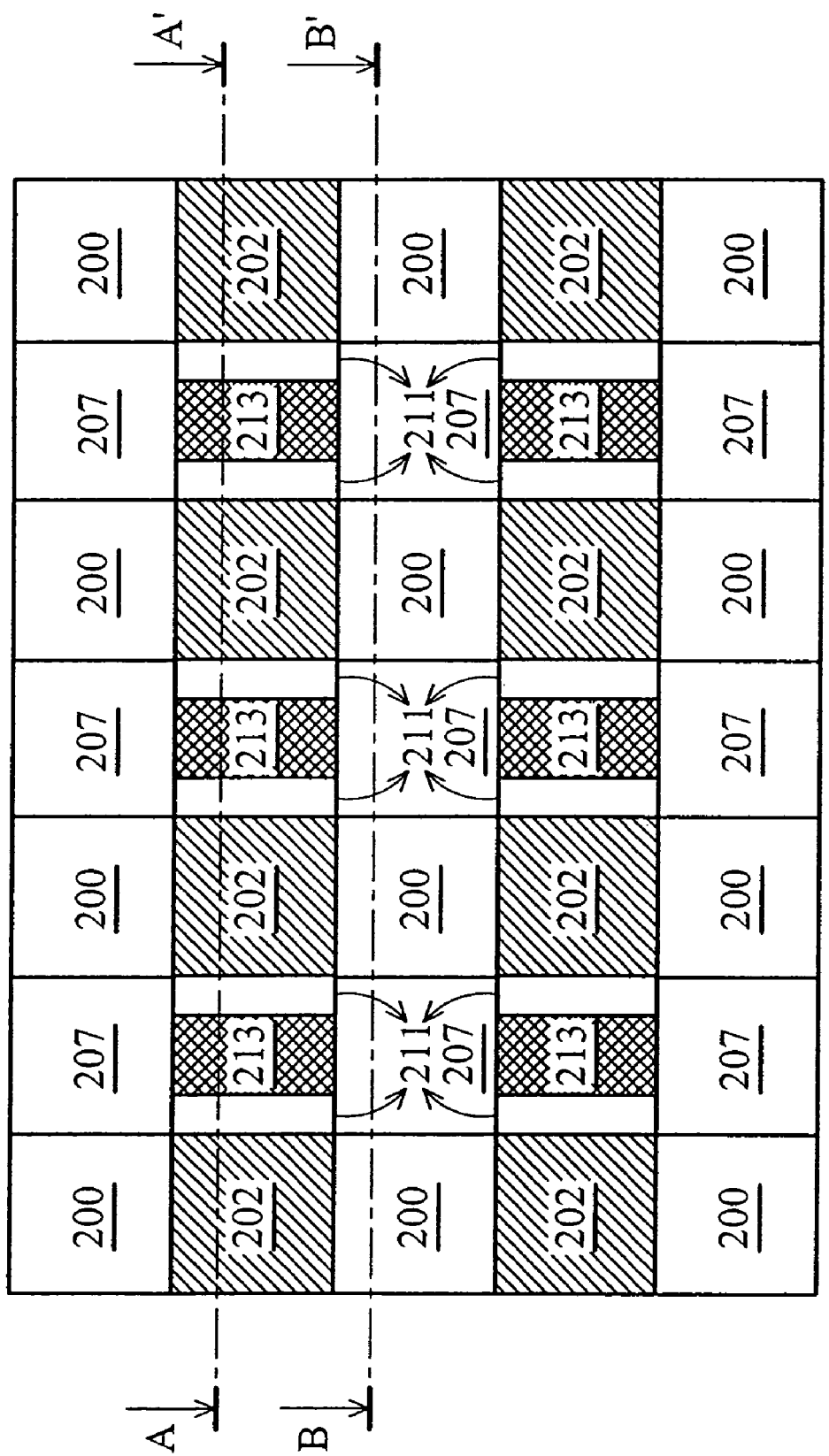
FIG. 2b is a schematic top view of corresponding cross-sections in FIG. 3j and FIG. 4j for one embodiment of the invention.
Figure 4J:
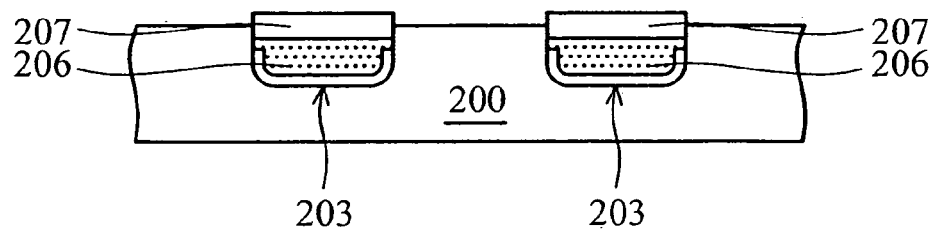

In FIG. 3j and FIG. 4j, a plurality of parallel long isolation trenches are formed in the substrate 200 (shown in FIG. 4j) along a second direction, perpendicular to the first direction of the long trenches 250, by sequential lithography and etching. The described etching process stops at the source isolation layer 207 of the long trench 250 therein and a plurality of trenches 250' comprising the cell structures are thus defined in the substrate 200. This top view is shown in FIG. 2b. FIG. 3j shows a cross-section along the A–A' line where the trenches comprising cell structures are located and FIG. 4j shows a cross-section along the B–B' where follow-up shallow trench isolation (STI) regions are located.

Figure 4K:
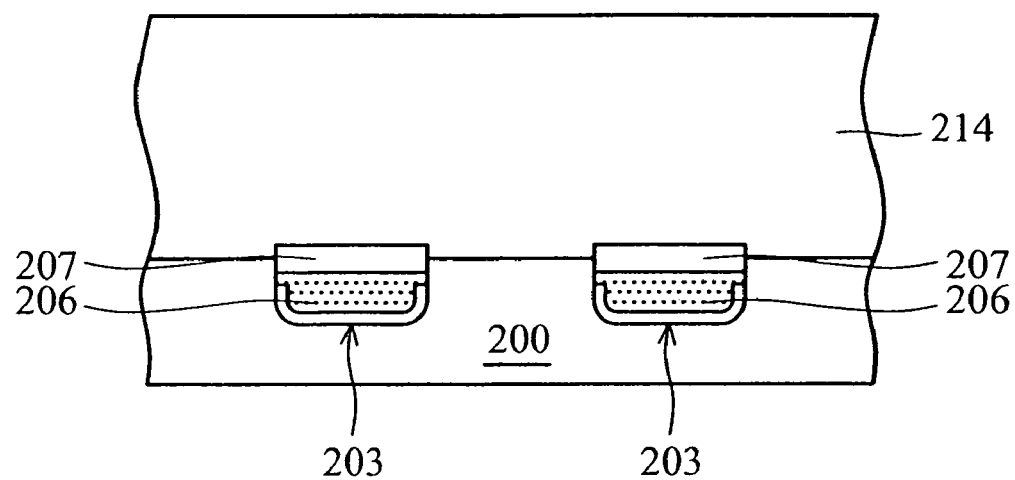

In FIG. 3k and FIG. 4k, materials of an insulating layer 214 are filled in the described long isolation trenches. The insulating material can be, for example, silicon dioxide formed by high density plasma chemical vapor deposition (HDP CVD).

Figure 4L:
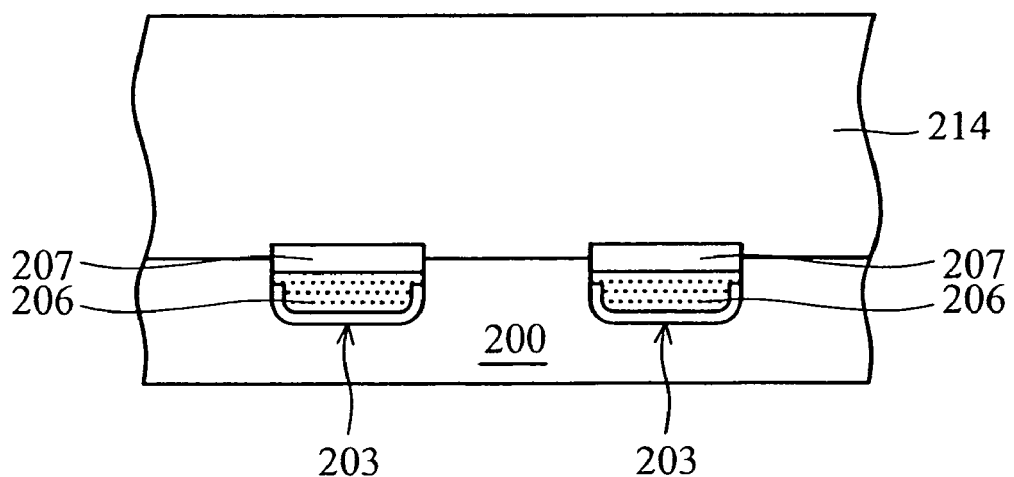

In FIG. 3l and FIG. 4l, a planarization process is then performed to level the wafer using the mask layer 202 as a polishing stop layer, leaving an insulating layer 214 therein and the shallow trench isolation (STI) region is thus formed. Next, the mask layer 202 is removed by, for example, wet etching, and the pad oxide layer 201 therebelow is exposed. Then a drain implantation (not shown) is performed on implant N-type impurities such as phosphorous (P) or arsenic (As) ions into the substrate 200. Then a thermal annealing process (not shown), for example a rapid thermal annealing (RTP) process, is performed and drain regions D are thus respectively formed in the substrate 200 adjacent to each trench 250'. Then the pad oxide layer 201 is removed and a second insulating layer 215 is formed on each drain region D. The second insulating layer 215 is formed by sequential deposition and planarization of materials of the second insulating layer 215. After the planarization, the wafer surface is leveled and the control gate 213 is thus exposed.

In FIG. 1, a top view illustrating possible follow-up wordline BL and bitline WL is shown. In FIG. 1, the control gates 213 within the cell trenches (referring to trench 250') are further connected by the interconnecting hypothesis wordlines WL and hypothesis bitlines BL in phantom structures. In addition, the bitlines BL can also connect the drain regions D therebelow by a proper contact window (not shown) and the stacked gate flash memory devices are thus formed.

Compared with flash memory cell of the Prior Art, the present invention has the following advantages.

First, cells of the flash memory device in accordance with the invention are trench-type stacked gate flash memory devices disposed in cell trenches within a substrate rather than that normally disposed on the surface of a substrate in the Prior Art. Memory cell design of the invention can achieve higher integration of memory cell capacity than that in the Prior Art.

In addition, most of the fabricating processes in the invention are self-aligned. Thus, additional lithography processes and number of masks for the whole fabricating process can be reduced. The complexity of fabricating the Stacked GATE flash memory device of the present invention is reduced and can be easily achieved.

Second, cells of the stacked gate flash memory device of the present invention are formed into the substrate. Thus, the size of each flash memory cell can be minimized and the integration of the memory cell can be increased. Thus the capacity of a flash memory device can be increased and the current within a cell can also be increased by enlarging the depth of the cell trench. Furthermore, most patterns of the masks for fabricating the stacked gate flash memory device are rectangular and can be easily fabricated. The costs of mask fabrication can be reduced and resolution limitations by the photolithography tools can be reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating stacked gate flash memory cells, comprising:

providing a substrate;

forming a plurality of parallel long trenches along a first direction in the substrate;

forming a conductive layer and a pair of source regions on the bottom of each of the long trenches, wherein the source regions are respectively disposed in the substrate adjacent to two sidewalls of each of the long trenches and electrically connected by the conductive layer therein;

forming a source isolation layer on the conductive layer;

forming a tunnel oxide on two sidewalls of each of the long trenches;

forming a U-shaped floating gate on the source isolation layer, contacting the tunnel oxide;

forming a pair of control gate spacers respectively disposed on the vertical portion of the U-shaped floating gate, substantially having the same width as the vertical portion;

forming a U-shaped inter-gate dielectric layer on the U-shaped floating gate and the control gate spacers;

forming a control gate on the U-shaped inter-gate dielectric layer;

forming a plurality of parallel shallow trench isolation (STI) regions along a second direction, thereby defining a plurality of cell trenches; and forming a drain region in the substrate adjacent to each of the cell trenches.

2. The method as claimed in claim 1, wherein the first direction is perpendicular to the second direction.

3. The method as claimed in claim 1, wherein the substrate is P-type silicon substrate.

4. The method as claimed in claim 1, further comprising before forming the plurality of parallel long trenches along the first direction in the substrate, sequentially forming a pad oxide layer and a mask layer on the substrate.

5. The method as claimed in claim 4, wherein the mask layer is silicon nitride.

6. The method as claimed in claim 4, wherein the pad oxide layer is silicon dioxide.

7. The method as claimed in claim 1, further comprising before forming the conductive layer and the pair of source regions on the bottom of each of the long trenches, forming a bottom insulating layer on the bottom of each of the long trenches.

8. The method as claimed in claim 1, wherein forming the conductive layer and the pair of source regions on the bottom of each of the long trenchs further comprises:

forming a source material layer on the bottom of each of the long trenches;

performing a thermal annealing process on the source material layer, driving out dopants therefrom, forming the pair of source regions in the substrate adjacent to two sidewalls of each of the long trenches, electrically connected by the conductive layer therebetween; and removing the source material layer from each of the long trenches.

9. The method as claimed in claim 8, wherein the source material layer is N-type doped polysilicon.

10. The method as claimed in claim 9, wherein the N-type doped polysilicon is selected from the group consisting of phosphorous (P) doped polysilicon and arsenic (As) doped polysilicon.

11. The method as claimed in claim 1, further comprising before forming the tunnel oxide on the two sidewalls of each of the long trench, performing a threshold voltage implantation on the sidewalls of each of the long trenches.

12. The method as claimed in claim 1, wherein forming the U-shaped floating gate on the source isolation layer, contacting the tunnel oxide further comprises:

conformably depositing a floating gate layer in each of the long trenchs;

forming a protective layer on the floating gate layer in each of the long trenches exposing portions of the floating gate layer; and removing portions of the floating gate layer exposed by the protective layer, thereby forming the U-shaped floating gate.

13. The method as claimed in claim 12, wherein the protective layer is boro-silicate-glass (BSG).

14. The method as claimed in claim 1, wherein forming the pair of control gate spacers, each disposed on the vertical portion of the U-shaped floating gate, having the same width as the vertical portions further comprises:

filling a space within the U-shaped floating gate by a protective layer;

conformably depositing material of a control gate spacer layer in each of the long trenches;

etching the materials of the control gate spacer layer, stopping at the protective layer in each of the long trenches, forming a control gate spacer disposed on each vertical portion of the U-shaped floating gate, substantially having a same width as that thereof; and removing the protective layer therein.

15. The method as claimed in claim 14, wherein the method for removing the protective layer is wet etching.

16. The method as claimed in claim 15, wherein the control gate spacer is silicon dioxide.

17. The method as claimed in claim 1, wherein forming a plurality of parallel shallow trench isolation (STI) regions along a second direction, defining a plurality of cell trenches, further comprises:

sequentially performing photolithography and etching, defining a plurality of parallel long isolation trenches along a second direction, stopping at the source isolation layer therein; and forming an insulating layer in each of the long isolation trenches.

18. The method as claimed in claim 17, wherein the insulating layer is silicon dioxide.

19. The method as claimed in claim 17, wherein the method of forming the insulating layer is high density plasma enhanced chemically vaporization deposition (HDP CVD).

20. The method as claimed in claim 4, wherein forming the drain region in the substrate adjacent to each of the cell trenches further comprises:

removing the mask layer, exposing the pad oxide layer;

performing a drain implantation;

performing a thermal annealing process, forming the drain region in the substrate adjacent each of the cell trenches; removing the pad oxide layer; and forming a second insulating layer on the drain region.

21. The method as claimed in claim 20, wherein impurities used in the drain region implantation are N-type impurities.

22. The method as claimed in claim 21, wherein the N-type impurities are selected from the group consisting of phosphorous (P) ions and arsenic (As) ions.

23. The method as claimed in claim 20, wherein the method for forming the second insulating layer is low pressure chemical vapor deposition (LPCVD).

\* \* \* \* \*